(12) United States Patent
Hung et al.

(10) Patent No.: US 10,141,431 B1
(45) Date of Patent: Nov. 27, 2018

(54) EPITAXY SOURCE/DRAIN REGIONS OF FINFETS AND METHOD FORMING SAME

(71) Applicant: Taiwan Semiconductor Manufacturing Company, Ltd., Hsinchu (TW)

(72) Inventors: Tung-Husan Hung, Hsinchu (TW); Guan-Jie Shen, Hsinchu (TW); Pin-Cheng Hsu, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/664,032

(22) Filed: Jul. 31, 2017

(51) Int. Cl.
*H01L 29/66* (2006.01)
*H01L 21/3065* (2006.01)
*H01L 21/02* (2006.01)
*H01L 29/06* (2006.01)
*H01L 29/08* (2006.01)
*H01L 21/762* (2006.01)
*H01L 21/311* (2006.01)
*H01L 29/78* (2006.01)

(52) U.S. Cl.
CPC .. *H01L 29/66795* (2013.01); *H01L 21/02532* (2013.01); *H01L 21/02636* (2013.01); *H01L 21/3065* (2013.01); *H01L 21/31116* (2013.01); *H01L 21/76232* (2013.01); *H01L 29/0653* (2013.01); *H01L 29/0847* (2013.01); *H01L 29/7851* (2013.01); *H01L 2029/7858* (2013.01)

(58) Field of Classification Search
CPC ......... H01L 29/66795; H01L 21/02532; H01L 21/02636; H01L 21/3065; H01L 21/31116; H01L 29/0653
See application file for complete search history.

(56) References Cited

U.S. PATENT DOCUMENTS

| | | |
|---|---|---|
| 2010/0015778 A1 | 1/2010 | Lin et al. |
| 2011/0210404 A1 | 9/2011 | Su et al. |
| 2013/0001705 A1 | 1/2013 | Su et al. |
| 2016/0149036 A1* | 5/2016 | Huang ................ H01L 29/7848 257/401 |
| 2016/0190017 A1* | 6/2016 | Lee ....................... H01L 21/845 257/192 |
| 2017/0077300 A1 | 3/2017 | Lee et al. |
| 2017/0103985 A1* | 4/2017 | Kim ................ H01L 21/823821 |
| 2017/0125410 A1* | 5/2017 | Li .................... H01L 21/823431 |
| 2017/0154990 A1* | 6/2017 | Sung ................ H01L 21/02532 |
| 2017/0162671 A1 | 6/2017 | Basker et al. |
| 2017/0186748 A1 | 6/2017 | Lee et al. |

* cited by examiner

*Primary Examiner* — Julia Slutsker
(74) *Attorney, Agent, or Firm* — Slater Matsil, LLP

(57) ABSTRACT

A method includes forming isolation regions extending into a semiconductor substrate, and recessing the isolation regions, so that portions of semiconductor strips between the isolation regions protrude higher than the isolation regions to form semiconductor fins. The method further includes recessing the semiconductor fins to form recesses, epitaxially growing a first semiconductor material from the recesses, etching the first semiconductor material, and epitaxially growing a second semiconductor material from the first semiconductor material that has been etched back.

20 Claims, 23 Drawing Sheets

US 10,141,431 B1

EPITAXY SOURCE/DRAIN REGIONS OF FINFETS AND METHOD FORMING SAME

BACKGROUND

Technological advances in Integrated Circuit (IC) materials and design have produced generations of ICs, with each generation having smaller and more complex circuits than the previous generations. In the course of IC evolution, functional density (for example, the number of interconnected devices per chip area) has generally increased while geometry sizes have decreased. This scaling down process provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

The formation of FinFETs typically involves forming semiconductor fins, implanting the semiconductor fins to form well regions, forming dummy gate electrodes on the semiconductor fins, etching portions of the semiconductor fins, and performing an epitaxy to regrow source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
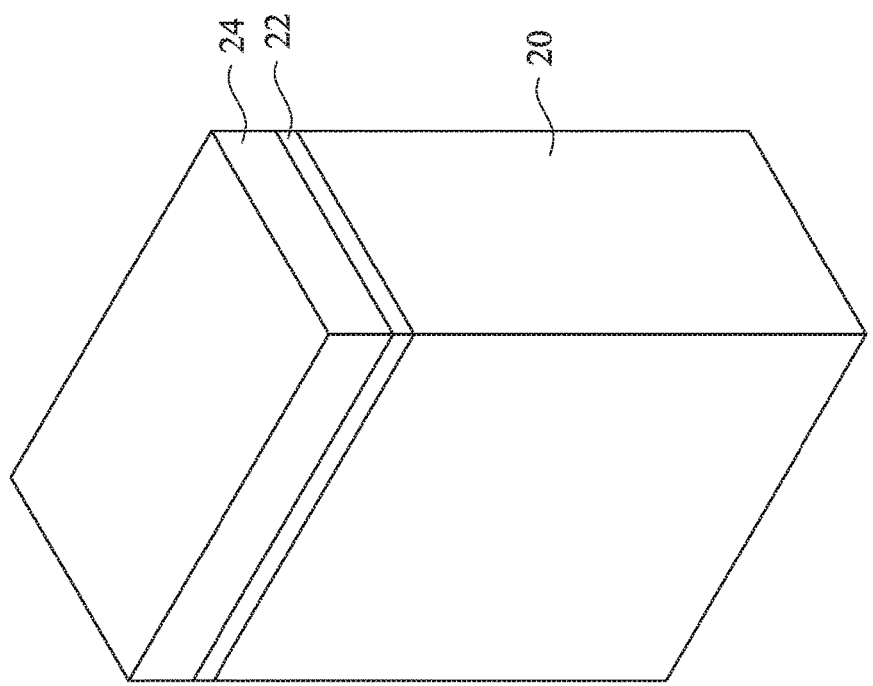
FIGS. 1 through 20 are cross-sectional views and perspective views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the methods of forming the same are provided in accordance with various exemplary embodiments. The intermediate stages of forming the FinFETs are illustrated. The variations of the embodiments are discussed. Throughout the various views and illustrative embodiments, like reference numbers are used to designate like elements.

Figure 20:
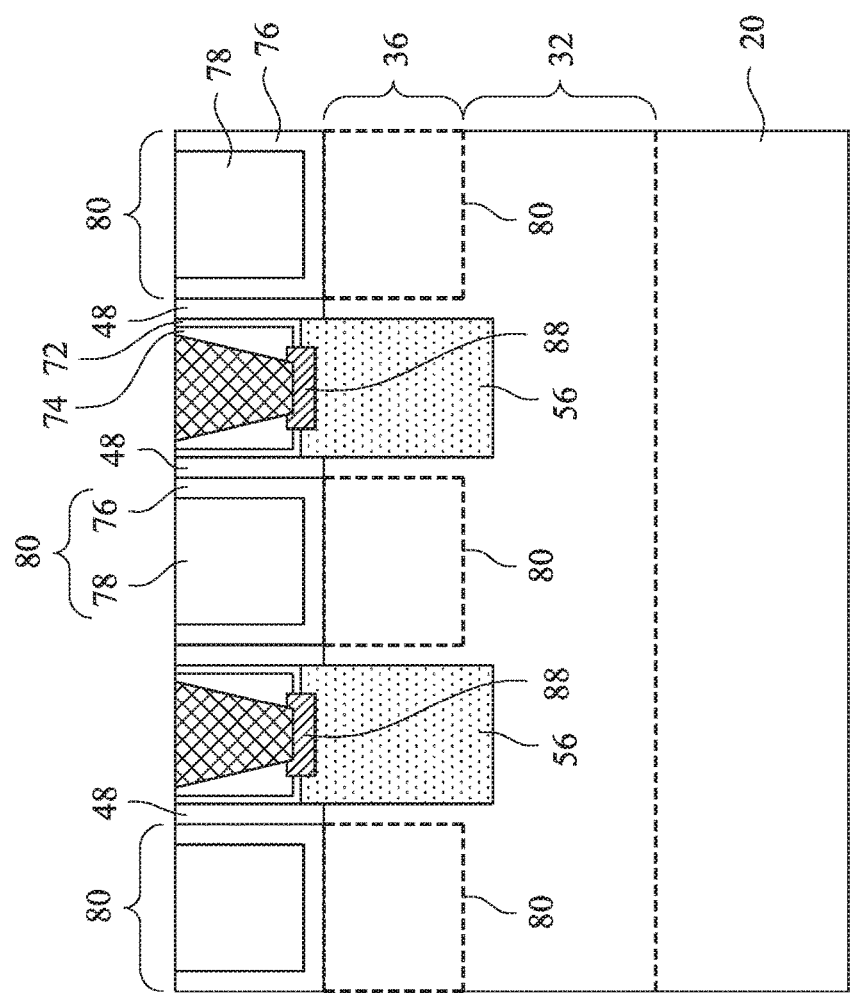
Figure 21:
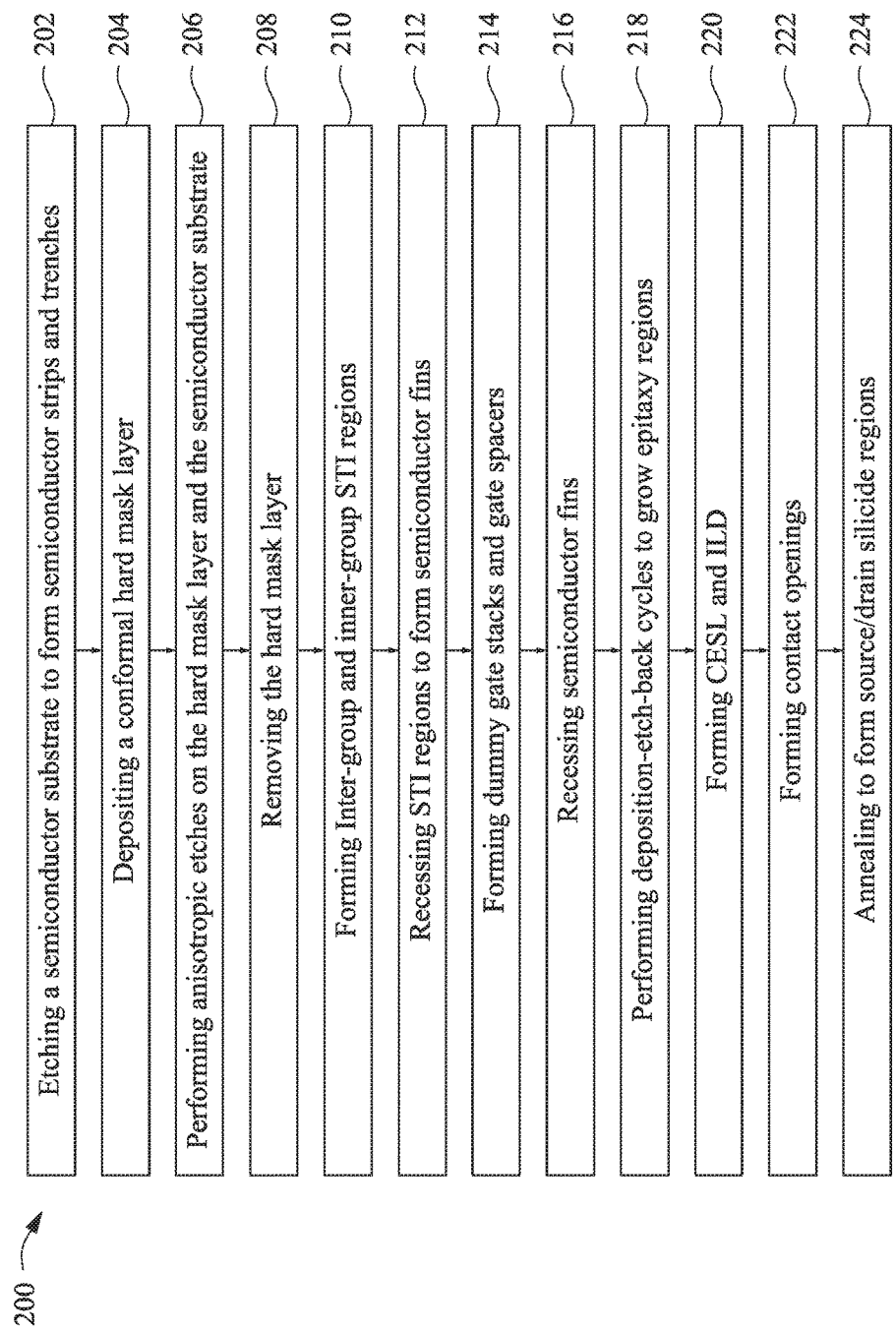
FIG. 21 illustrates a process flow for forming FinFETs in accordance with some embodiments.

FIGS. 1 through 20 illustrate the perspective views and cross-sectional views of intermediate stages in the formation of FinFETs in accordance with some embodiments. The steps shown in FIG. 1 through 20 are also illustrated schematically in the process flow 200 as shown in FIG. 21.

FIG. 1 illustrates a perspective view of substrate 20, which is a part of a semiconductor wafer. Substrate 20 is a semiconductor substrate such as a silicon substrate, a silicon carbon substrate, a silicon germanium substrate, a silicon-on-insulator substrate, or a substrate formed of other semiconductor materials. Substrate 20 may also be formed of other semiconductor materials such as III-V compound semiconductor materials. Substrate 20 may be lightly doped with a p-type or an n-type impurity.

Pad oxide 22 and hard mask 24 are formed over semiconductor substrate 20. In accordance with some embodiments of the present disclosure, pad oxide 22 is formed of silicon oxide, which may be formed by oxidizing a surface layer of semiconductor substrate 20. Hard mask 24 may be formed of silicon nitride, silicon oxynitride, silicon carbide, silicon carbo-nitride, or the like.

Figure 2:
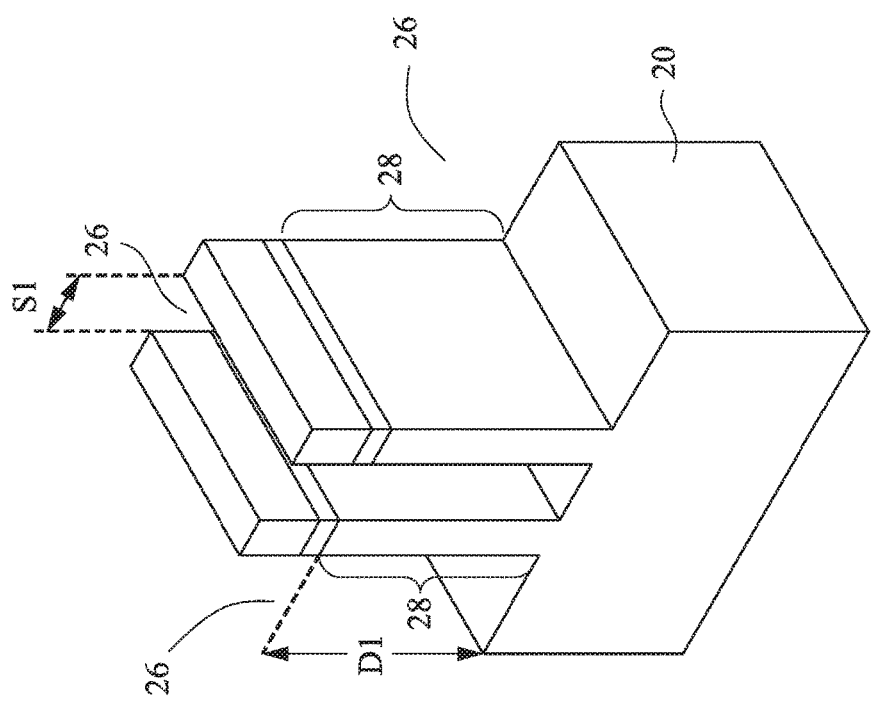

Next, as shown in FIG. 2, hard mask 24, pad oxide 22, and substrate 20 are patterned to form trenches 26. Accordingly, semiconductor strips 28 are formed. The respective step is illustrated as step 202 in the process flow shown in FIG. 21. Trenches 26 extend into semiconductor substrate 20, and have lengthwise directions parallel to each other. In accordance with some embodiments of the present disclosure, depth D1 of trenches 26 are in the range between about 80 nm and about 130 nm. It is appreciated that the values recited throughout the description are examples, and different values may also be adopted without changing the principle of the present disclosure.

Figure 19:
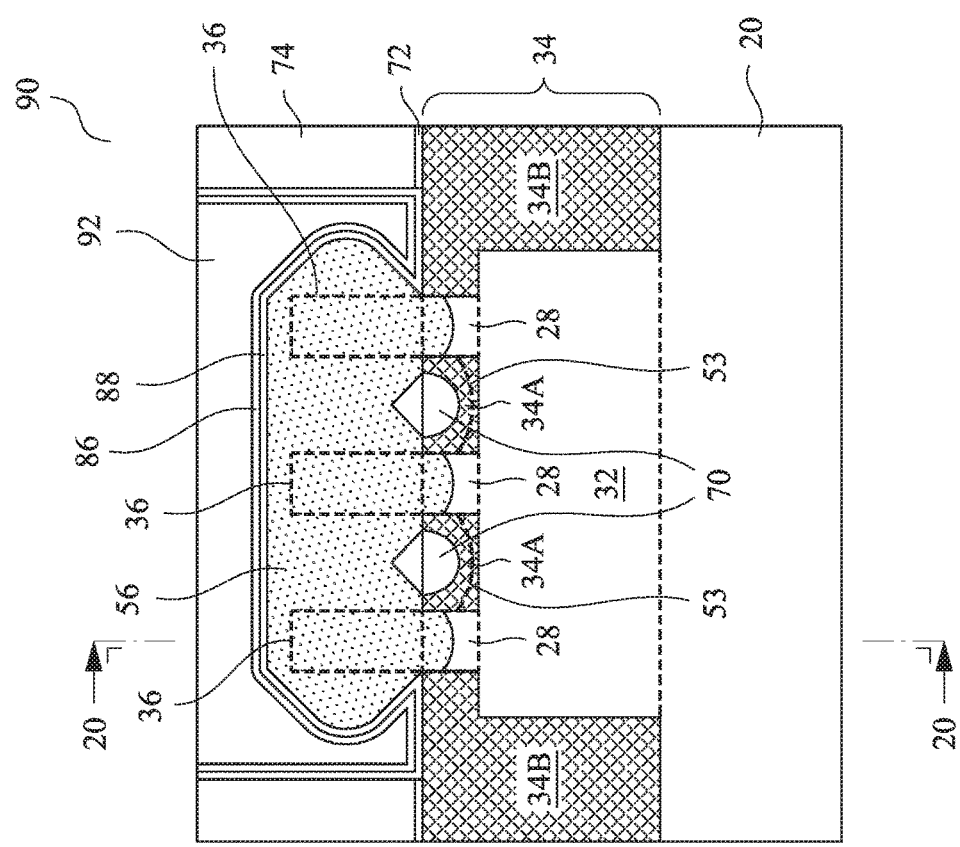

The illustrated device region is a multi-fin device region in the respective wafer (and chip). In accordance with some embodiments of the present disclosure, the illustrated device region is an n-type FinFET region, in which an n-type FinFET is to be formed. In accordance with other embodiments of the present disclosure, the illustrated device region is a p-type FinFET region, in which a p-type FinFET is to be formed. In the illustrated exemplary embodiments of the present disclosure, two semiconductor strips are illustrated as an example, and the two semiconductor strips are to be used in combination to from a same FinFET. It is realized that more semiconductor strips may be used for forming the same FinFET, as shown in FIG. 19 as an example.

Throughout the description, the plurality of semiconductor strips for forming the same FinFET is referred to in combination as a semiconductor strip group. In accordance with some embodiments of the present disclosure, the neighboring semiconductor strips 28 in the same strip group have spacing S1 (referred to as inner-group spacing) smaller than the spacing between the neighboring strip groups (referred to as inter-group spacing). The neighboring strip groups are used to form different FinFETs.

Figure 3A:
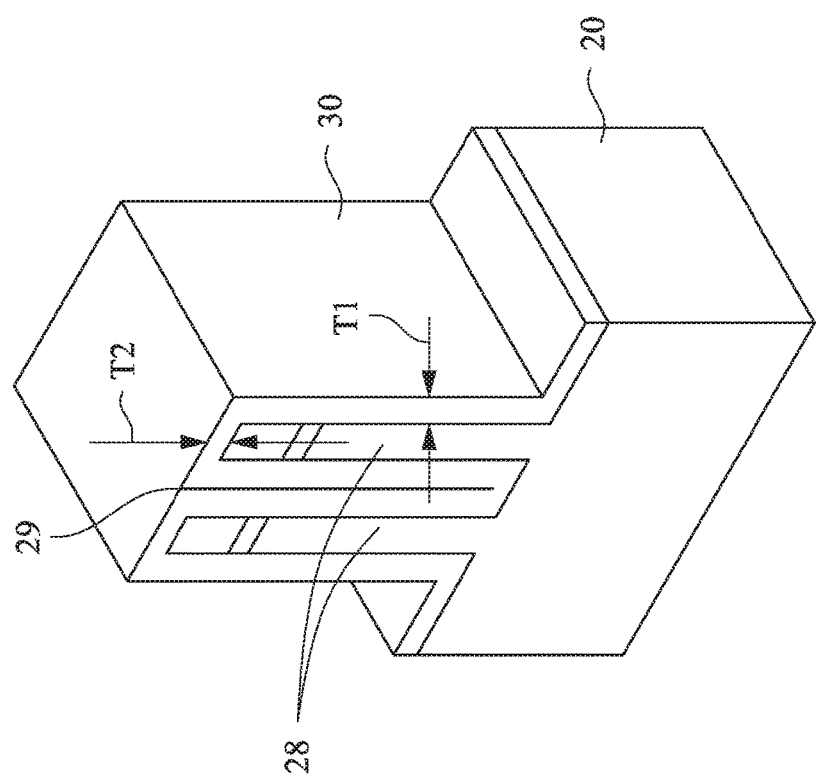

Referring to FIG. 3A, hard mask layer 30 is formed to cover semiconductor strips 28. The respective step is illustrated as step 204 in the process flow shown in FIG. 21. Hard mask layer 30 extends on the top surfaces and sidewalls of semiconductor strips 28. Furthermore, hard mask layer 30 extend on the top surface of the portions of semiconductor substrate 20 underlying trenches 26. The deposition method is selected so that the resulting hard mask layer 30 is substantially conformal, with the thickness T1 of the vertical portions equal to or substantially equal to thickness T2 of the horizontal portions. For example, thickness T1 may be between about 80 percent and 100 percent of thickness T2. In accordance with some embodiments of the present disclosure, the deposition method includes Atomic Layer Deposition (ALD), Low Pressure Chemical Vapor Deposition (LPCVD), Chemical Vapor Deposition (CVD), or the like.

Figure 3B:
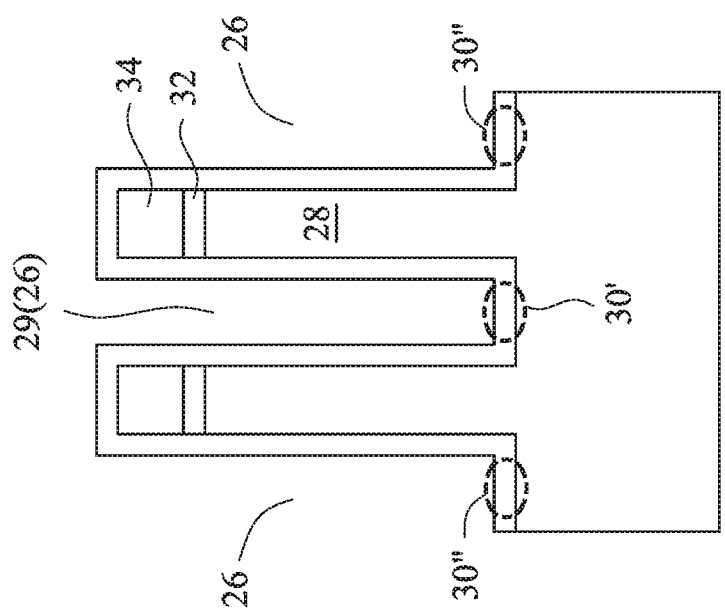

Hard mask layer 30 may be formed of aluminum oxide ($Al_2O_3$), silicon nitride, silicon oxide, or the like. Hard mask layer 30 includes two vertical portions between neighboring semiconductor strips 28, each on the sidewall of one of semiconductor strips 28. The two neighboring vertical portions of hard mask layer 30 are spaced apart from each other by space 29, which is also shown in FIG. 3B. FIG. 3B illustrates the cross-sectional view of the structure shown in FIG. 3A, and illustrates gap 29 between two neighboring vertical portions of hard mask layer 30. Gap 29 has a very high aspect ratio, which may be greater than about 15, and may be between about 15 and about 30. It is appreciated that gap 29 is the unfilled portion of the respective trench 26. In subsequent discussion, the term "outer trenches" are used to refer to trenches 26 that are on the outer side (the illustrated left side and right side) of the outmost semiconductor strips 28 in the same strip group. The term "inner trenches" are used to refer to trenches 26 that are between semiconductor strips 28 in the same strip group. Outer trenches 26 have smaller aspect ratios than gap 29.

Figure 4:
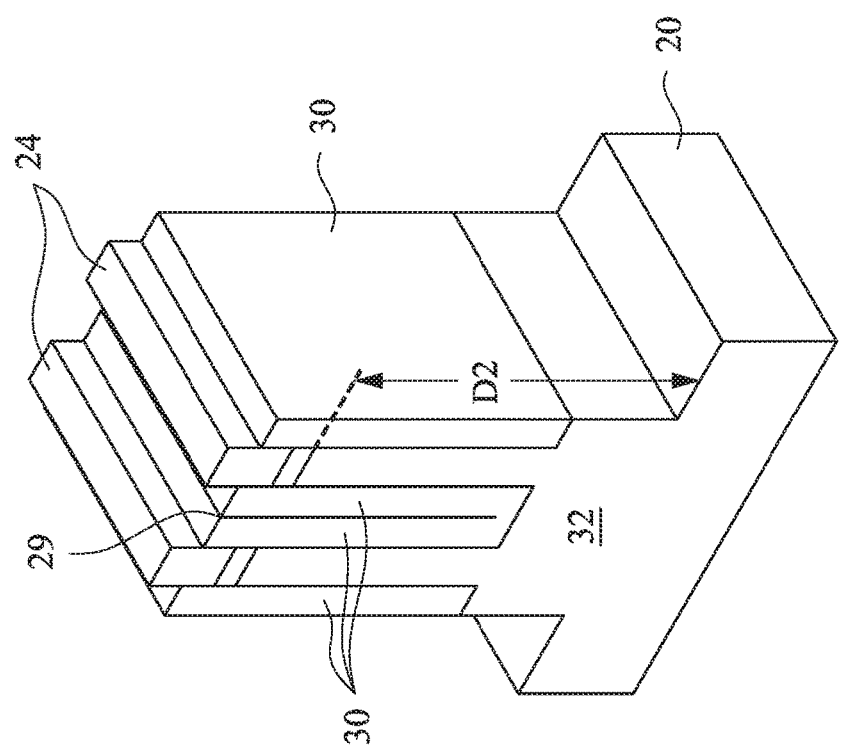

Next, referring to FIG. 4, a first anisotropic etch is performed to remove the horizontal portions of hard mask layer 30. The respective step is illustrated as step 206 in the process flow shown in FIG. 21. The first anisotropic etch may be performed through dry etch using, for example, hydrogen fluoride (HF) as an etching gas. The vertical portions of hard mask layer 30 on the sidewalls of semiconductor strips 28 remain after the first anisotropic etch.

As a result of the etching, the top surfaces of hard masks 24 are exposed. Furthermore, the top surfaces of semiconductor substrate 20 at the bottom of outer trenches 26 are also exposed. After the first anisotropic etch, a second anisotropic etch is performed to further etch semiconductor substrate 20, so that outer trenches 26 further extend lower than the bottom edges of hard mask layer 30. The respective step is also illustrated as step 206 in the process flow shown in FIG. 21. In accordance with some embodiments of the present disclosure, depth D2 of trenches 26 is increased to be in the range between about 120 nm and about 160 nm. The depth difference (D2-D1) may be in the range between about 30 nm and about 50 nm in accordance with some exemplary embodiments.

In accordance with some embodiments of the present disclosure, the second anisotropic etch is performed using an etchant gas different from the etchant gas used in the first anisotropic etch. In accordance with alternative embodiments, the first and the second anisotropic etches are performed using a same etchant gas such as a fluorine-containing gas or a chlorine-containing gas. The first and the second anisotropic etch steps may be performed in a same process chamber with no break in between. Throughout the description, the portions of semiconductor substrate 20 higher than the bottoms of the extended outer trenches 26 and lower than semiconductor strips 28 are referred to as semiconductor strip base 32, which is the base over which semiconductor strips 28 are resided. Semiconductor strip base 32 is over an underlying bulk portion of semiconductor substrate 20.

In the second etching step, hard masks 24 and the vertical portions of hard mask layer 30 are in combination used as the etching mask for the second anisotropic etch, and hence the sidewalls of semiconductor strip base 32 may be vertically aligned to the outer sidewalls of the vertical portions of hard mask layer 30. Depending on the etching process, there may be some undercuts formed, resulting in the exposed sidewalls of semiconductor strip base 32 to be tilted and recessed from the respective outer edges of the vertical portions of hard mask layer 30.

Referring back to FIG. 3B, in gap 29, horizontal portion 30' of hard mask layer 30 is at the bottom of, and is exposed to, gap 29. Horizontal portion 30' may have a thickness equal to thickness T2, which is the thickness of portion 30" in outer trenches 26. Outer trenches 26 have a lower aspect ratio than gap 29. In accordance with some embodiments of the present disclosure, due to the high aspect ratio of gap 29 (FIG. 3B), in the first and the second anisotropic etch processes, the etching rate of the bottom portion 30' of hard mask layer 30 under gap 29 is much lower than the etching rate of bottom portions 30" in outer trenches 26. Bottom portion 30' hence remains after the first and the second etching steps. The portions of semiconductor strip base 32 directly under gap 29 are thus protected from the etching steps shown in FIG. 4.

Figure 5:
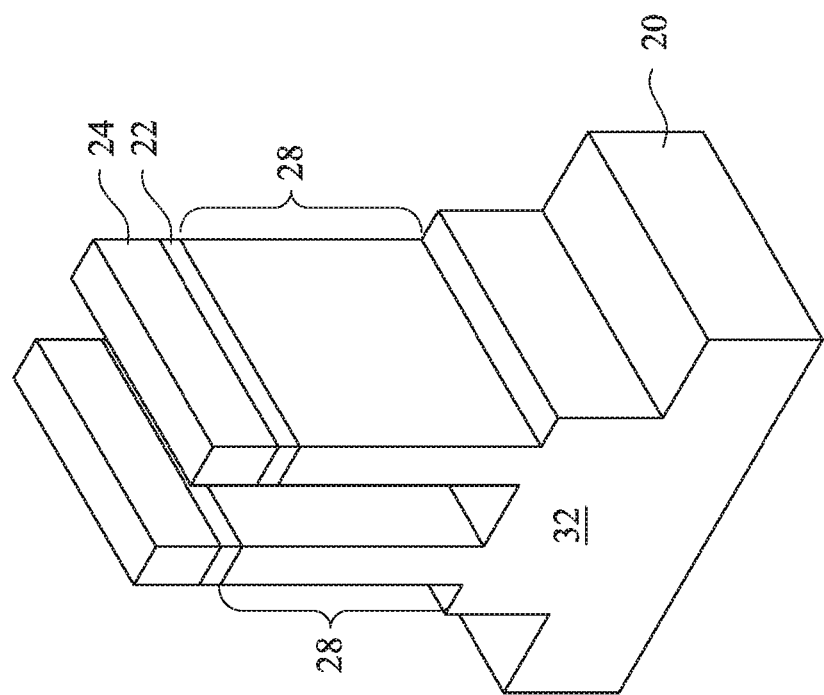

Next, an isotropic etch such as a wet etch is performed to remove remaining portions of hard mask layer 30, thus exposing the sidewalls of semiconductor strip base 32. The respective step is illustrated as step 208 in the process flow shown in FIG. 21. The resulting structure is shown in FIG. 5, which shows a plurality of semiconductor strips 28 standing over the same semiconductor strip base 32. Although two semiconductor strips 28 are illustrated as an example, there may be a single one, three, four, or more semiconductor strips 28 standing on the same strip base 32. Throughout the description, semiconductor strip base 32 may be considered as parts of substrate 20, or may be considered as a separate part over bulk substrate 20.

Figure 6A:
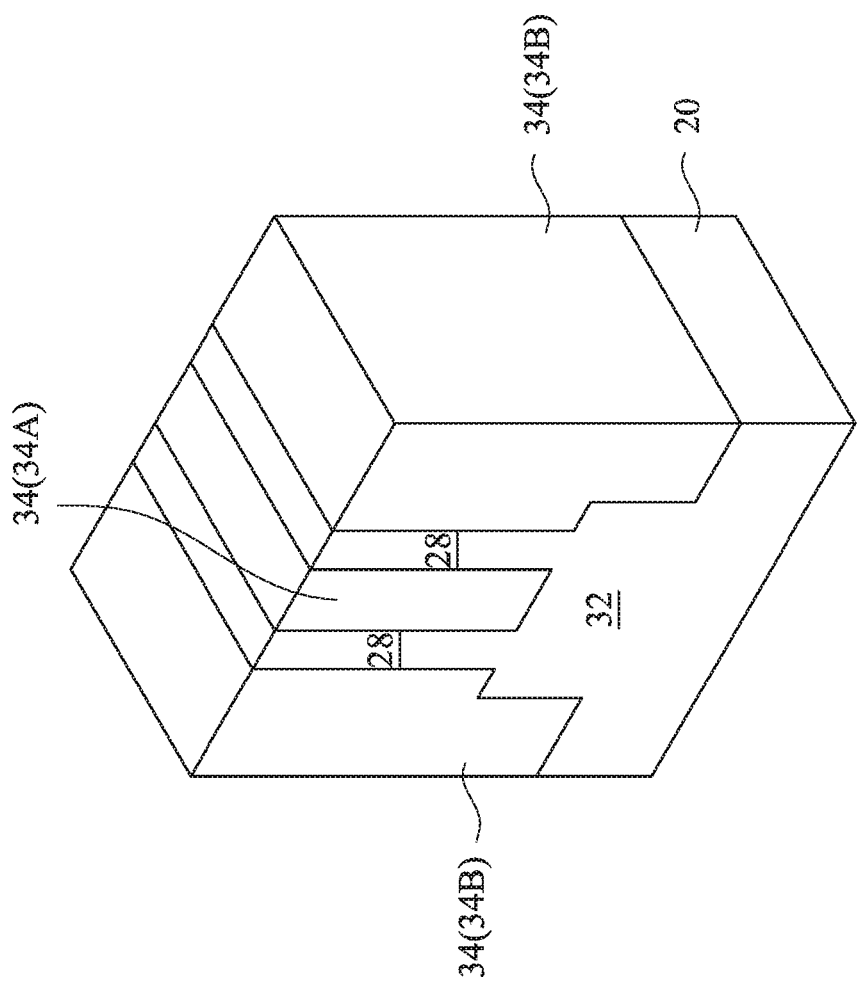

Next, as shown in FIG. 6A, isolation regions 34, which may be Shallow Trench Isolation (STI) regions, are formed in trenches 26 (FIG. 5). The respective step is illustrated as step 210 in the process flow shown in FIG. 21. The formation may include forming a liner oxide such as silicon oxide on the exposed portions of semiconductor regions 20, 28, and 32, filling remaining trenches 26 with a dielectric material(s), for example, silicon oxide using Flowable Chemical Vapor Deposition (FCVD), and performing a CMP to level the top surface of the dielectric material with the top surface of hard masks 24 (shown in FIG. 5). After the CMP, hard masks 24 (FIG. 5) are removed. Alternatively, the CMP stops on the top surfaces of semiconductor strips 28. In a top view (not shown) of the structure shown in FIG. 6A, each of semiconductor strip base 32 may be a strip encircled by the respective STI regions 34, or may be an elongated strip with the opposite ends connected to bulk semiconductor substrate 20. Throughout the description, the portions of STI regions 34 between two neighboring semiconductor strips 28 in the same strip group are referred to as inner-group STI regions 34, which are also denoted as 34A. The illustrated inner-group STI region 34A may represent a plurality of inner-group STI regions 34A. The STI regions 34 on the outer sides of the outmost semiconductor strips 28 of the same strip group are referred to as inter-group STI regions, which are denoted as 34B.

Figure 6B:
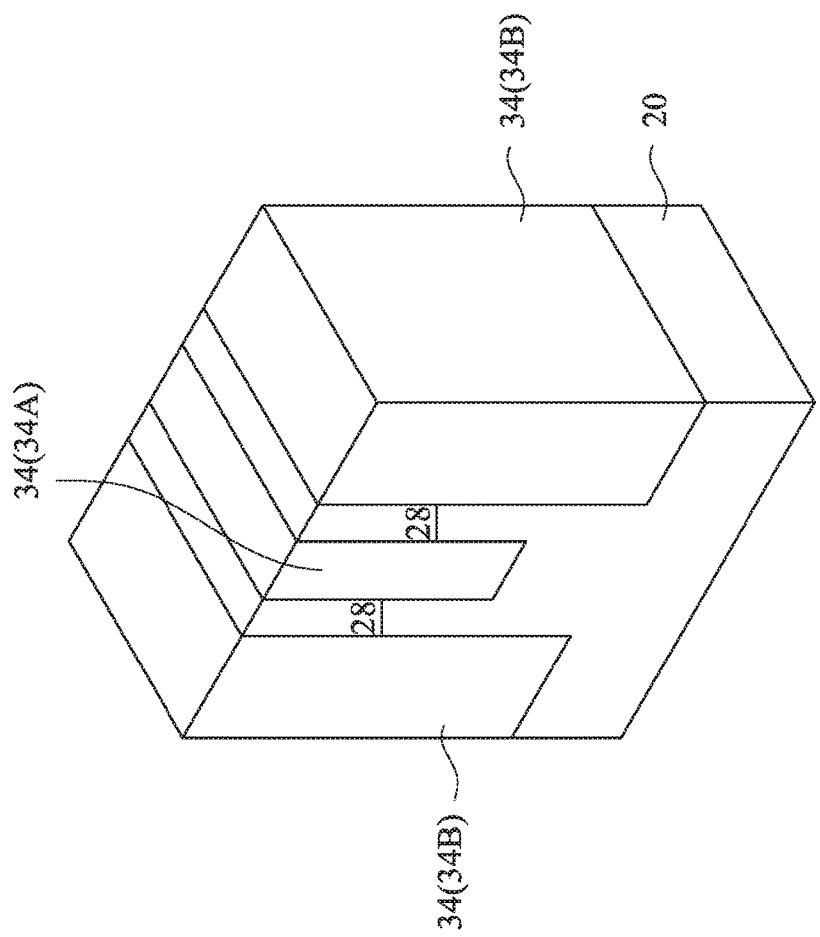

FIG. 6B illustrates STI regions 34 formed in accordance with alternative embodiments of the present disclosure. In accordance with some embodiments of the present disclosure, inter-group STI regions 34B and inner-group STI regions 34A are formed through separate processes. For example, the formation of inter-group STI regions 34B includes a first etching process to etch semiconductor substrate 20, and then filling the respective trenches. Before or after the formation of inter-group STI regions 34B, inner-group STI regions 34A are formed, and the formation includes a second etching process to etch semiconductor substrate 20, and then filling the respective trenches. Since inner-group STI regions 34A and inter-group STI regions 34B are formed separately, they can be formed of the same dielectric material or different materials selected from silicon oxide, silicon nitride, silicon carbide, silicon oxynitride, or the like.

Figure 7:
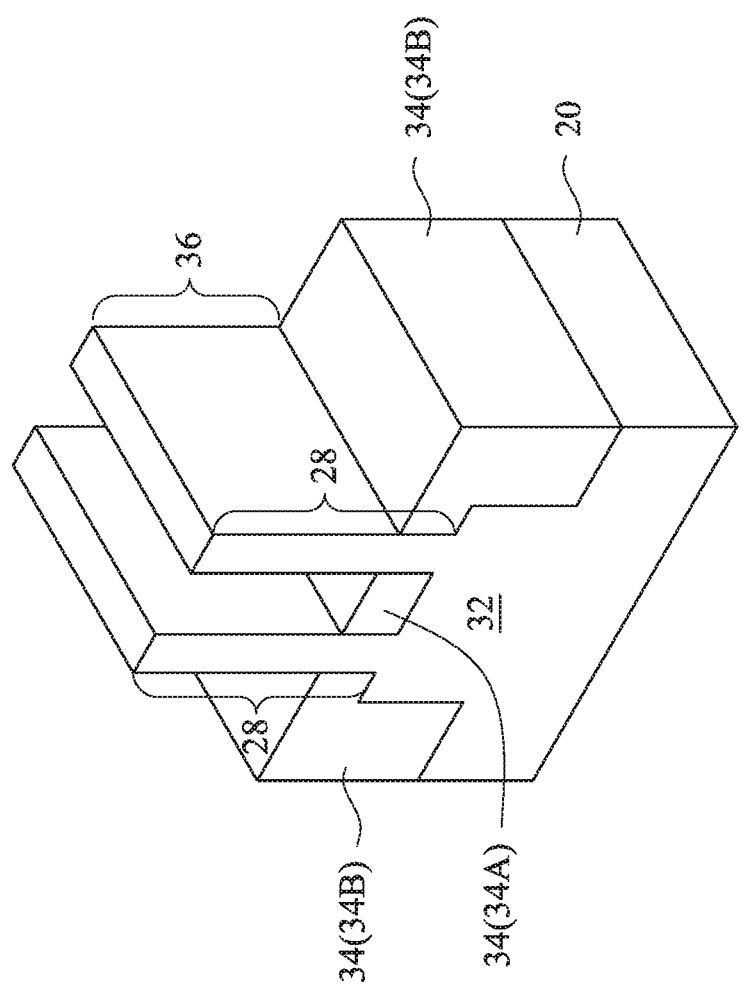

Next, referring to FIG. 7, STI regions 34 are recessed, so that the top surfaces of the resulting STI regions 34 are lower than the top surfaces of semiconductor strips 28. The respective step is illustrated as step 212 in the process flow shown in FIG. 21. Throughout the description, the top portions of semiconductor strips 28 protruding higher than the top surfaces of STI regions 34 are referred to as semiconductor fins 36. The top surfaces of the remaining STI regions 34 are further higher than the top surface of semiconductor strip base 32.

Figure 8:
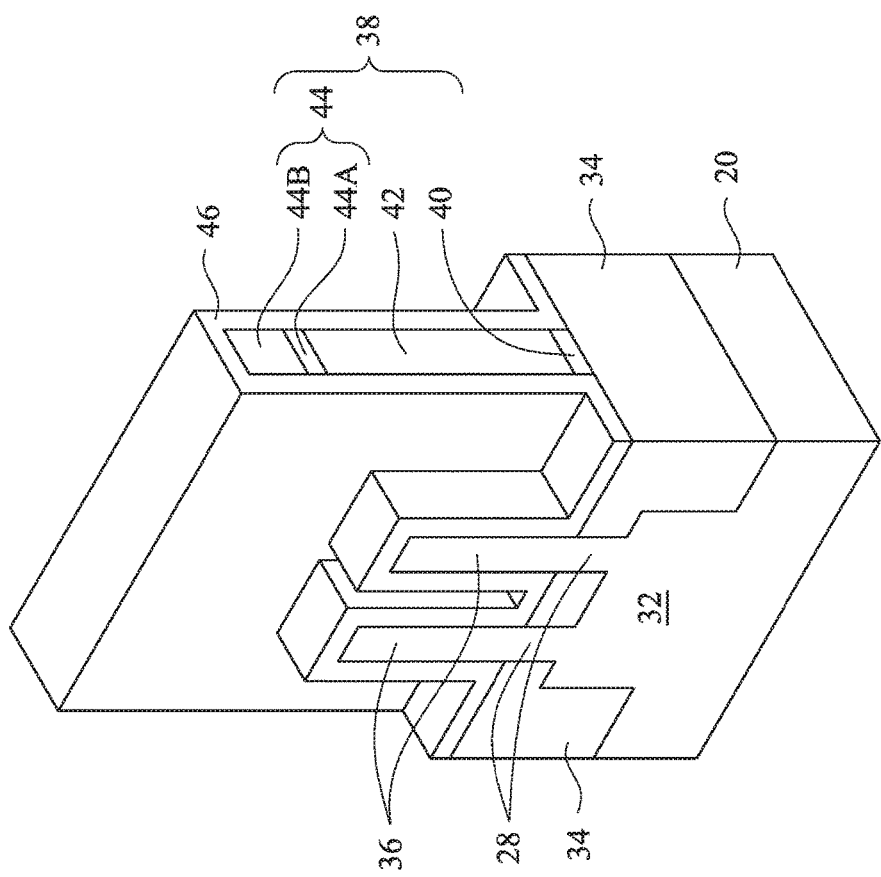

Referring to FIG. 8, dummy gate stack 38 is formed on semiconductor fins 36. The respective step is illustrated as step 214 in the process flow shown in FIG. 21. Although a single dummy gate stack 38 is illustrated, there may be a plurality of parallel dummy gate stacks 38 formed simultaneously, with each of the plurality of dummy gate stacks crossing over each of semiconductor strips 28. Dummy gate stack 38 covers some portions of semiconductor fins 36, leaving other portions not covered. In accordance with some embodiments of the present disclosure, dummy gate stack 38 includes dummy gate dielectric 40 and dummy gate electrode 42 over dummy gate dielectric 40. Dummy gate dielectric 40 may be formed of silicon oxide, and dummy gate electrode 42 may be formed of, for example, polysilicon. Hard mask 44 is formed over dummy gate electrode 42, and is used as an etching mask in the formation of dummy gate electrode 42. Hard mask 44 may include silicon nitride and/or silicon oxide, and may be a single layer or a composite layer including a plurality of layers. For example, hard mask 44 may include silicon oxide 44A and silicon nitride layer 44B over pa silicon d oxide 44A. The formation of dummy gate stack 38 may include depositing the respective layers as blanket layers, and then etching the blanket layers. Dummy gate stack 38 may have lengthwise directions substantially perpendicular to the lengthwise direction of the respective semiconductor fins 36.

Referring further to FIG. 8, spacer layer 46 is formed. In accordance with some embodiments of the present disclosure, spacer layer 46 is formed of silicon oxide, silicon nitride, silicon oxynitride, silicon oxy-carbo-nitride (SiOCN), silicon carbo-nitride (SiOC), aluminum oxide, or multi-layers thereof. In accordance with some embodiments of the present disclosure, spacer layer 46 is formed of SiOCN, and may have a single-layer structure. In accordance with alternative embodiments, spacer layer 46 has a composite structure including a plurality of layers. For example, spacer layer 46 may include a silicon oxide layer, and a silicon nitride layer over the silicon oxide layer. Spacer layer 46 is formed using a conformal deposition method such as ALD.

Figure 9:
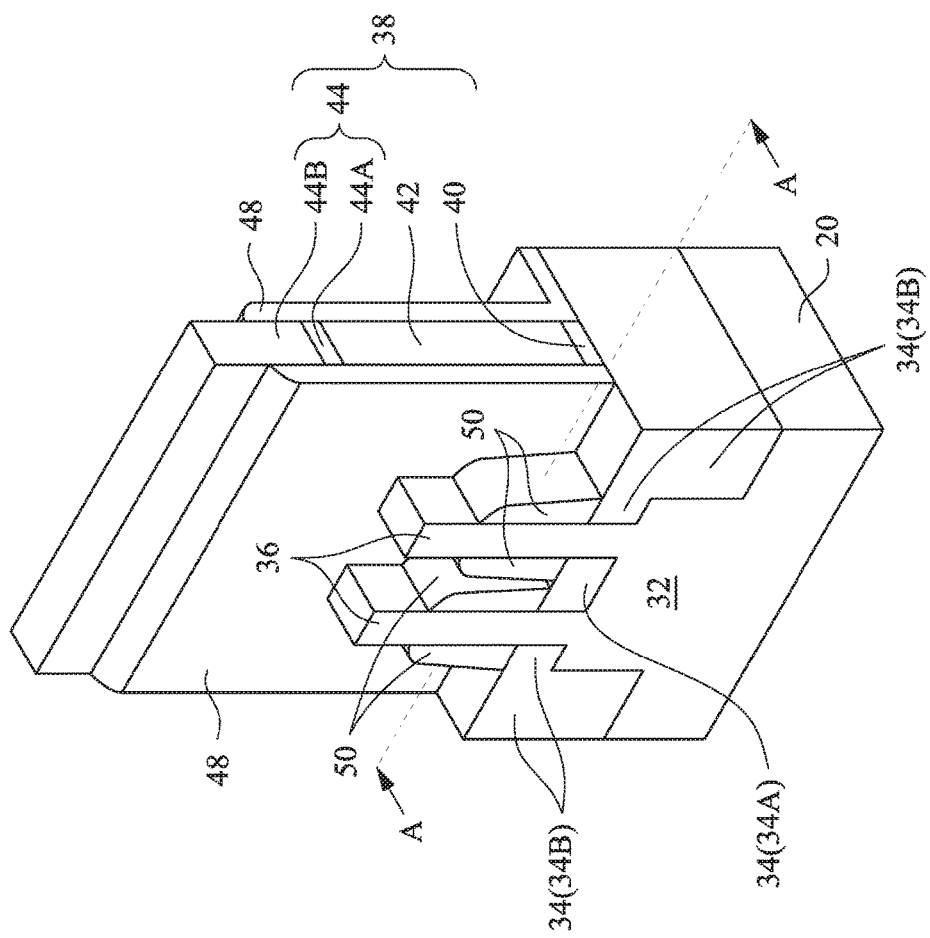

FIG. 9 illustrates the etching of spacer layer 46 to form gate spacers 48, which are on the sidewalls of dummy gate stack 38. In accordance with some embodiments of the present disclosure, an anisotropic etch is performed to etch spacer layer 46. The horizontal portions of spacer layer 46 are removed. In addition, since the heights of semiconductor fins 36 are lower than that of dummy gate stack 38, the heights of the vertical portions of spacer layer 46 on the sidewalls of semiconductor fins 36 are relatively small, and hence may be fully removed in the etching. Alternatively, some portions of spacer layer 46 may be left as fin spacers 50. On the other hand, the vertical portions of spacer layer 46 on the sidewalls of dummy gate stack 38 have portions remaining after the etching, which remaining portions are referred to as gate spacers 48. Due to the etching, the top surfaces of gate spacers 48 are lower than the top surfaces of dummy gate stack 38.

Figure 10:
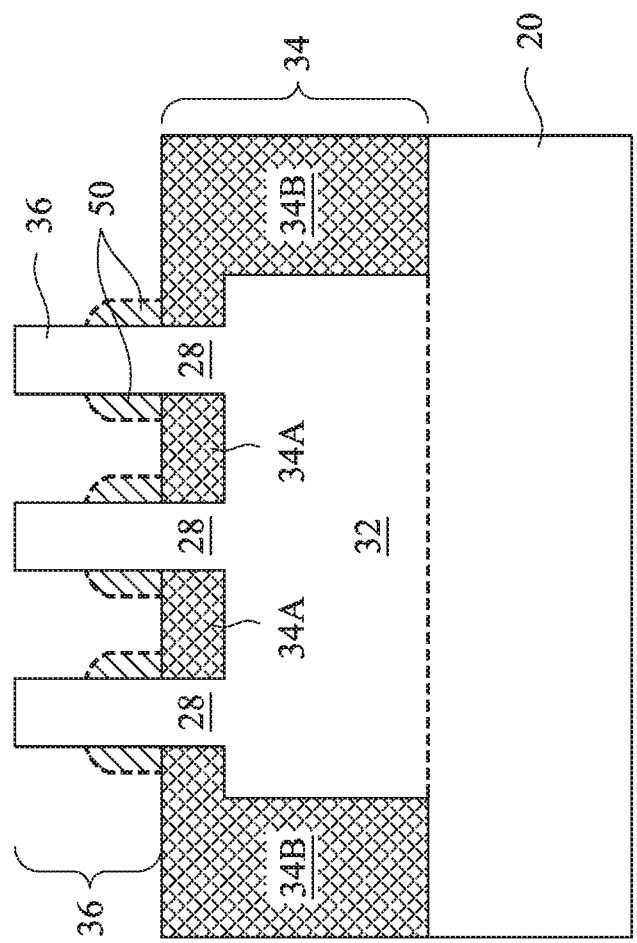

FIG. 10 illustrates a cross-sectional view of the structure shown in FIG. 9, wherein the cross-sectional view is obtained from the vertical plane containing line A-A in FIG. 9. Furthermore, the vertical plane crosses the portions of semiconductor fins 36 not covered by dummy gate stack 38 and gate spacers 48. In FIG. 10, fin spacers 50 are shown as being left on the sidewalls of semiconductor fins 36 in accordance with some embodiments of the present disclosure. In accordance with alternative embodiments, no fin spacers remain. Accordingly, fin spacers 50 are illustrated using dashed lines to indicate they may or may not exist.

Figure 11:
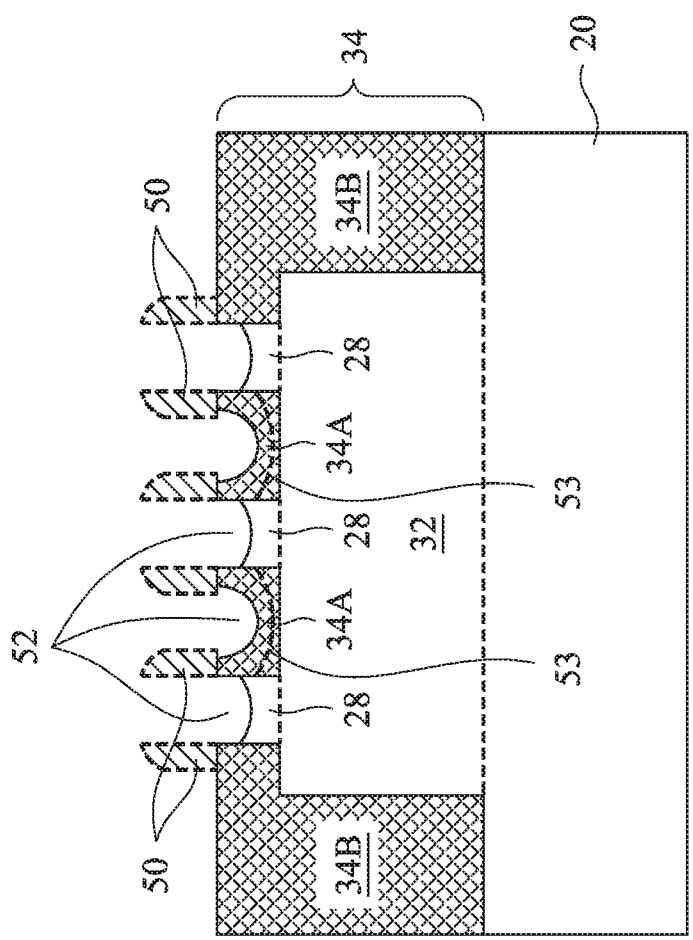

Next, as shown in FIG. 11, the exposed portions of semiconductor fins 36 not covered by dummy gate stack 38 and gate spacers 48 (FIG. 9) are etched to form recesses 52. The respective step is illustrated as step 216 in the process flow shown in FIG. 21. The etching is anisotropic, so that the portions of semiconductor fins 36 directly underlying dummy gate stack 38 (FIG. 9) are protected from being etched. After semiconductor fins 36 are etched, the etching is continued to remove some portions of semiconductor strips 28 between STI regions 34, so that recesses 52 further extend between STI regions 34. The etching may be performed using, for example, the mixture of gases $HBr/Cl_2/O_2$, the mixture of gases $HBr/Cl_2/O_2$, or the mixture of gases $HBr/Cl_2/O_2/CF_2$. After the formation of trenches 52, an additional etching may be performed to remove remaining fin spacers 50, if any is left at this time. The etching may be isotropic, and may be performed using dry etch or wet etch.

In accordance with some embodiments of the present disclosure, after the recessing and the etching step as shown in FIG. 11, the top surfaces of inner-group STI regions 34A have portions at substantially the same level as the top surfaces of inter-group STI regions 34B. In accordance with alternative embodiments, the etching process (such as the composition of the etchant) is adjusted, so that the top surfaces of inner-group STI regions 34A are lower than the top surfaces of the inter-group STI regions 34B. This may be achieved regardless of whether inner-group STI regions 34A and inter-group STI regions 34B are formed of the same or different materials. The lower surfaces of inner-group STI regions 34A are illustrated using dashed lines 53. In accordance with some embodiments as illustrated in FIG. 6B, inner-group STI regions 34A and inter-group STI regions 34B are formed of different material, which makes it easy to adjust the top surface levels of STI regions 34A and 34B.

FIGS. 12 through 16 illustrate the process for re-grow epitaxy region(s) 56, which is grown from the remaining semiconductor strips 28. Epitaxy regions 56 form the source/drain region of the resulting FinFET. Epitaxy regions 56 may include silicon germanium doped with boron when the respective FinFET is a p-type FinFET, or may include silicon phosphorous or silicon carbon phosphorous when the respective FinFET is an n-type FinFET.

Figure 12:
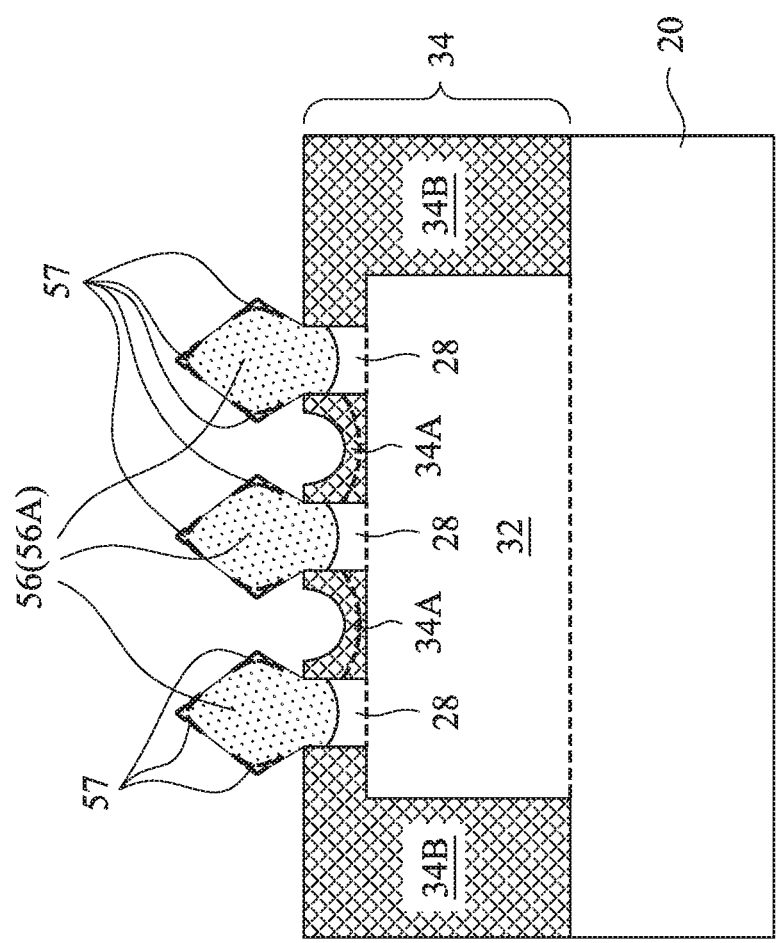

FIG. 12 illustrates an intermediate stage in the epitaxy of epitaxy regions 56. The respective epitaxy regions 56 formed by this epitaxy step is alternatively denoted as epitaxy regions 56A. In accordance with some embodiments in which the respective device is an n-type FinFET, epitaxy regions 56A include silicon phosphorous, with the phosphorous having a first concentration, which may be in the range between about $1 \times 10^{18}/cm^3$ and about $1 \times 10^{20}/cm^3$ in accordance with some embodiments. The process gas may include silane and a phosphorous-containing process gas. Also, an etching gas such as HCl may be added into the process gas to achieve selective growth. In accordance with some embodiments in which the respective device is a p-type FinFET, epitaxy regions 56A include silicon germanium boron, with boron having a first concentration, which may also be in the range between about $1 \times 10^{18}/cm^3$ and about $1 \times 10^{20}/cm^3$ in accordance with some embodiments. The process gas may include silane, germane, and a boron-containing process gas. Also, an etching gas such as HCl may be added into the process gas.

Figure 13:
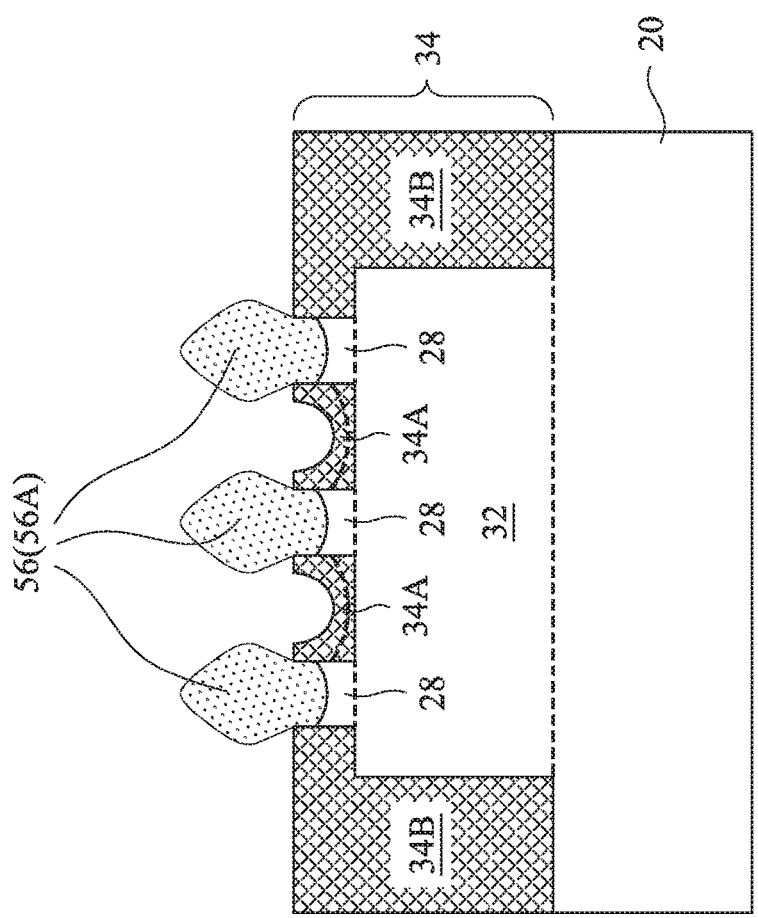

An etch-back is then performed on the epitaxy regions 56A in FIG. 12. As a result, the corner portions of epitaxy regions 56A in dashed regions 57 are removed, and the resulting epitaxy regions 56A are shown in FIG. 13. The steps shown in FIGS. 12 and 13 are illustrated as step 218 in the process flow shown in FIG. 21. When the corner portions of epitaxy regions 56A are etched, the exposed non-corner portions of epitaxy regions 56 are also etched back. However, the corner regions of epitaxy regions 56A are etched faster than the non-corner portions, and hence epitaxy regions 56A are smoothened and rounded. In accordance with some embodiments of the present disclosure, the etch-back is performed with process gases including an etching gas such as HCl, and the process gases do not include the process gases for depositing epitaxy regions 56. For example, the process gases used in the etch-back do not include silane and germane. In accordance with alternative embodiments of the present disclosure, the etch-back is performed with process gases including an etching gas such as HCl, and a process gas(es) used for depositing epitaxy regions 56 (such as silane and germane). As a result, both deposition and etching occur at the same time. The process conditions such as the flow rates of the etching gas and the deposition gases are controlled, so that etching rate is higher than the deposition rate, and the net effect is etching. Throughout the description, a deposition step and the subsequent etch-back are in combination referred to as a deposition-etch-back cycle, and the net result of the deposition-etch-back cycle is deposition.

In accordance with some embodiments of the present disclosure, the etch-back is isotropic (for example, without applying bias power in the etching chamber during the etch-back), so that both the side corner regions and top corner regions of epitaxy regions 56A are etched back with similar rates. This may be used when the neighboring FinFETs are close, and it is desirable that the lateral growth of epitaxy regions 56A is limited to prevent bridging of the epitaxy regions of different FinFETs. In accordance with alternative embodiments, the etch-back has anisotropic effect in addition to the isotropic effect (for example, by applying a bias power in the etching chamber during the etch-back), so that the top corners are flattened more than side corners. This will result in the top surface profile of the resulting merged epitaxy regions to be flatter, as will be discussed in subsequent paragraphs.

Throughout the description, the epitaxy of epitaxy regions 56A (which have a lower phosphorous concentration, boron concentration, or germanium concentration than subsequently grown epitaxy regions 56B as in FIG. 15) is referred to as a layer-1 deposition. In accordance with some embodiments of the present disclosure, the layer-1 deposition includes one deposition-etch-back cycle or a plurality of deposition-etch-back cycles, each resulting in the epitaxy regions 56A to be enlarged.

Figure 14:
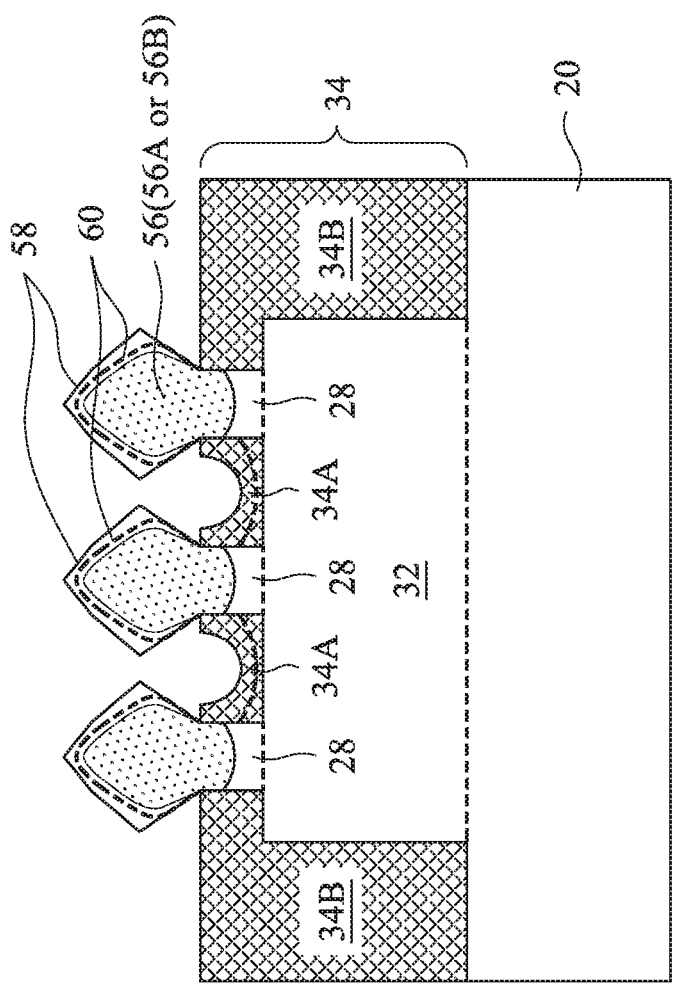

FIG. 14 illustrates an additional deposition-etch-back cycle of epitaxy regions 56. In accordance with some embodiments of the present disclosure, epitaxy regions 56, after the further growth, have surfaces at the positions denoted by solid lines 58. An etch-back is performed on epitaxy regions 56, and the surface is recessed back to the positions denoted by dashed lines 60. The process gases and conditions of the additional deposition-etch-back cycle may be similar to the corresponding ones of the preceding deposition-etch-back cycle. In accordance with some embodiments, the grown epitaxy regions in the second deposition-etch-back cycle are also epitaxy regions 56A, which have the same composition as the epitaxy regions 56A deposited in FIG. 12. In accordance with alternative embodiments, the grown epitaxy regions in the second deposition-etch-back cycle are epitaxy regions 56B, as will be discussed in subsequent paragraphs.

Figure 15:
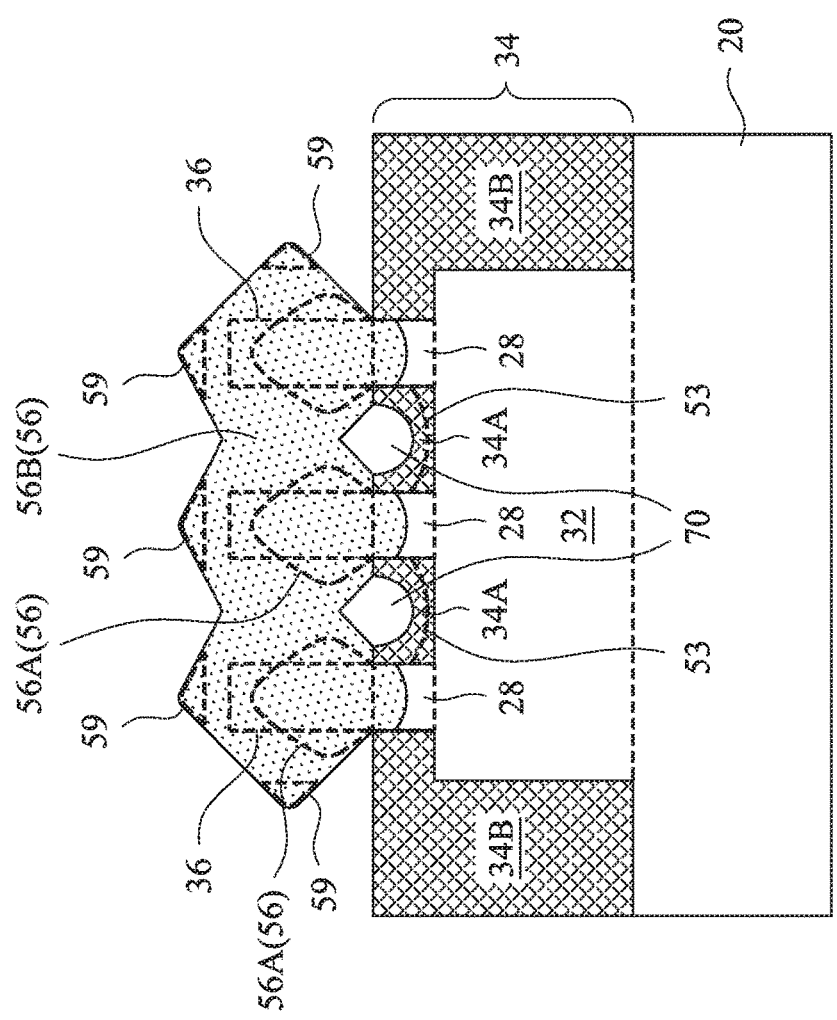

FIG. 15 illustrates the continued growth (or growth and etch-back) to form epitaxy regions 56 (refer to as 56B hereinafter), which results in discrete epitaxy regions 56 to merge to form a continuous epitaxy region 56. Air gaps 70 may be formed and sealed in epitaxy regions 56. In accordance with some embodiments of the present disclosure, each of air gaps 70 includes a rounded bottom portion and a triangular top portion. The triangular top portion has substantially straight edges as illustrated. Air gaps 70 may also have other shapes, depending on the epitaxy process and the material of epitaxy regions 56. The positions of semiconductor fins 36 are also shown. Since semiconductor fins 36 are not in the illustrated plane, they are shown as being dashed.

The deposition steps shown in FIGS. 12 through 16 may include a layer-1 deposition for forming epitaxy regions 56A, and a layer-2 deposition step for forming epitaxy regions 56B, which are formed on epitaxy regions 56A. Epitaxy regions 56A and 56B are in combination referred to as epitaxy regions 56. Epitaxy regions 56B have a composition(s) different from that of epitaxy regions 56A. For example, epitaxy regions 56B may have higher impurity concentrations than epitaxy regions 56A. In accordance with some embodiments in which the respective device is an n-type FinFET, epitaxy regions 56B include silicon phosphorous, with the phosphorous having a second phosphorous concentration higher than the first phosphorous concentration in epitaxy regions 56A. For example, the first phosphorous concentration may be in the range between about $1 \times 10^{18}/cm^3$ and about $1 \times 10^{20}/cm^3$, and the second phosphorous concentration may be in the range between about $1 \times 10^{19}/cm^3$ and about $1 \times 10^{21}/cm^3$ in accordance with some embodiments. The second phosphorus concentration may be one order, two orders, or more, higher than the first phosphorus concentration.

In accordance with some embodiments in which the respective device is a p-type FinFET, epitaxy regions 56B include silicon germanium boron with boron having a second boron concentration higher than the first boron concentration in epitaxy regions 56A. For example, the first boron concentration may be in the range between about $1 \times 10^{18}/cm^3$ and about $1 \times 10^{20}/cm^3$, and the second boron concentration may be in the range between about $1 \times 10^{19}/cm^3$ and about $1 \times 10^{21}/cm^3$ in accordance with some embodiments. The second boron concentration may be one order, two orders, or more higher than the first boron concentration. The germanium atomic percentage in epitaxy regions 56B (if SiGeB is used for p-type FinFET) may also be higher than the germanium atomic percentage in epitaxy regions 56A.

In accordance with some embodiments, the transition from layer-1 deposition to the layer-2 deposition occurs before the merge of epitaxy regions 56. The resulting structure is similar to what is shown in FIG. 15, in which epitaxy regions 56B merge with each other, while epitaxy regions 56A do not merge. In accordance with alternative embodiments, the transition from layer-1 deposition to the layer-2 deposition occurs after the merge of epitaxy regions 56. In the resulting structure, epitaxy regions 56A (rather than 56B) will merge with each other. Each of the layer-1 deposition and layer-2 deposition may include one or a plurality of deposition-etch-back cycles.

The merge of discrete epitaxy regions 56 requires the lateral growth of epitaxy regions 56, and the lateral growth occurs when epitaxy regions 56 are grown to higher than the top surface of STI regions 34, so that no STI regions 34 prevent the lateral growth. In accordance with some embodiments of the present disclosure, inner-group STI regions 34A have surfaces (shown as dashed lines 53) lower than the top surfaces of inter-group STI regions 34B, and hence the outer sidewalls of the outmost epitaxy regions 56 start lateral growth later than the inner sidewalls facing inter-group STI regions 34A. This reduces the likelihood of the epitaxy regions 56 to be bridged to the epitaxy regions of neighboring FinFETs, while the lateral growth for merging epitaxy regions 56 of the same FinFET is maintained.

Figure 16:
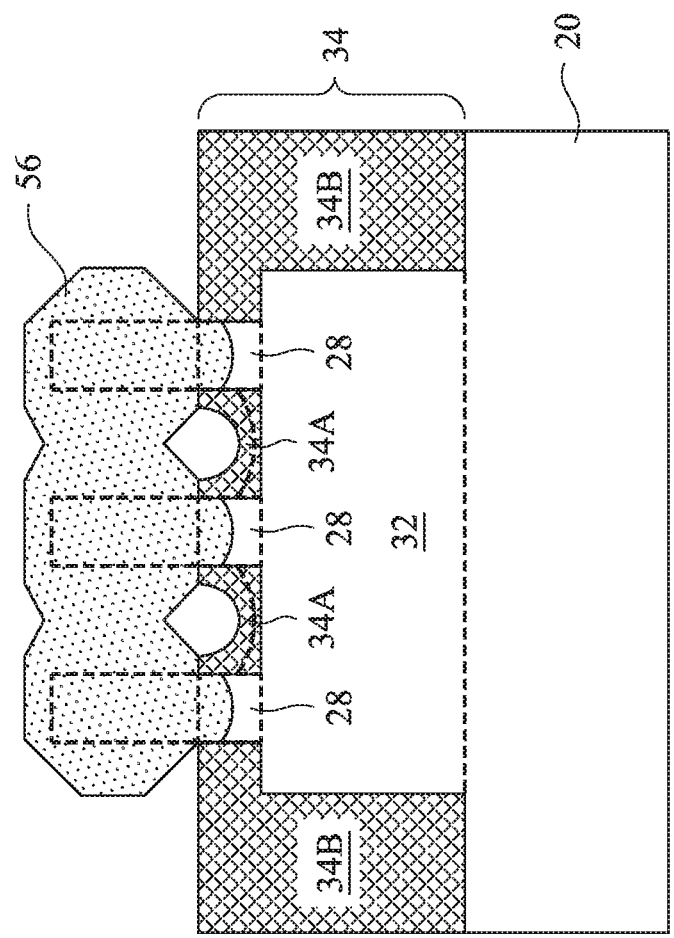

Next, an etch-back is performed, wherein dashed regions 59 represent the portions of epitaxy region 56 removed during the etch-back. The resulting structure is shown in FIG. 16. It is appreciated that the exposed portions (of epitaxy region 56) other than the corner regions are also etched back. However, the corners of epitaxy region 56 are etched faster than other regions, and hence epitaxy region 56 is smoothened and rounded.

Figure 17:
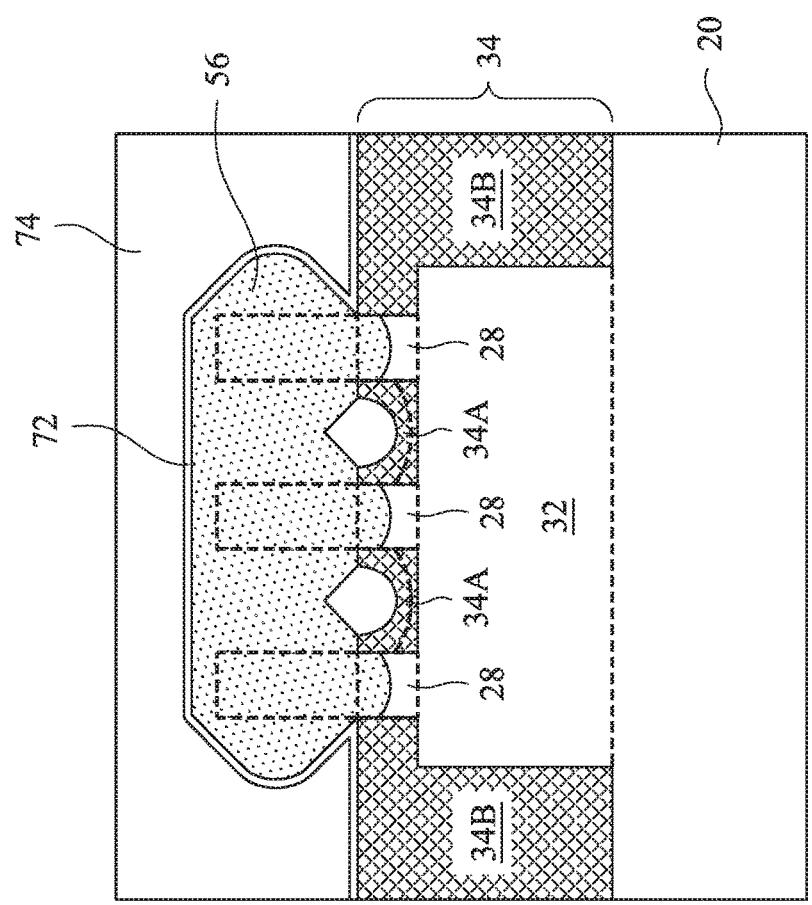

After the formation of epitaxy region 56 is finished, the top surface of epitaxy region 56 may be similar to what is shown in FIG. 16, in which there is a slight up-and-down topology. The top surface may also be similar to what is shown in FIG. 17, wherein the top surface of epitaxy region 56 has a flat portion extending directly over several semiconductor strips 28, with the flat portion of the top surface of epitaxy region 56 having no distinguishable recess directly over where discrete epitaxy regions 56 join with each other. This is achieved, for example, through at least one etch-back after the merging of epitaxy regions 56, or through a plurality of deposition-etch-back cycles performed after epitaxy regions 56 are merged, with each of the deposition-etch-back cycles resulting in the top surface to be flatter.

Subsequently, a plurality of process steps is performed to finish the formation of the FinFET. As shown in FIG. 17, Contact etch stop layer (CESL) 72 and Inter-Layer Dielectric (ILD) 74 are formed over epitaxy region 56 and dummy gate stack 38 (refer to FIG. 9). The respective step is illustrated as step 220 in the process flow shown in FIG. 21. A planarization such as Chemical Mechanical Polish (CMP) or mechanical grinding is performed to remove excess portions of CESL 72 and ILD 74, until dummy gate stack 38 (FIG. 9) is exposed. The dummy gate stack 38 is replaced with a replacement gate. The step for forming the replacement gate is not shown. However, the resulting replacement gate 80 is shown in FIG. 20. As illustrated in FIG. 20, replacement gate 80 includes gate dielectric 76 on the top surfaces and sidewalls of the respective fins 36, and gate electrode 78 over gate dielectric 76. Gate dielectric 76 may include an interfacial layer formed through thermal oxidation. The formation of gate dielectric 76 may also include one or a plurality of deposition steps, and the resulting formed layer(s) of gate dielectric 76 may include a high-k dielectric material(s). Gate electrode 78 is then formed on gate dielectric 76, and may be formed of metal layers.

Figure 18:
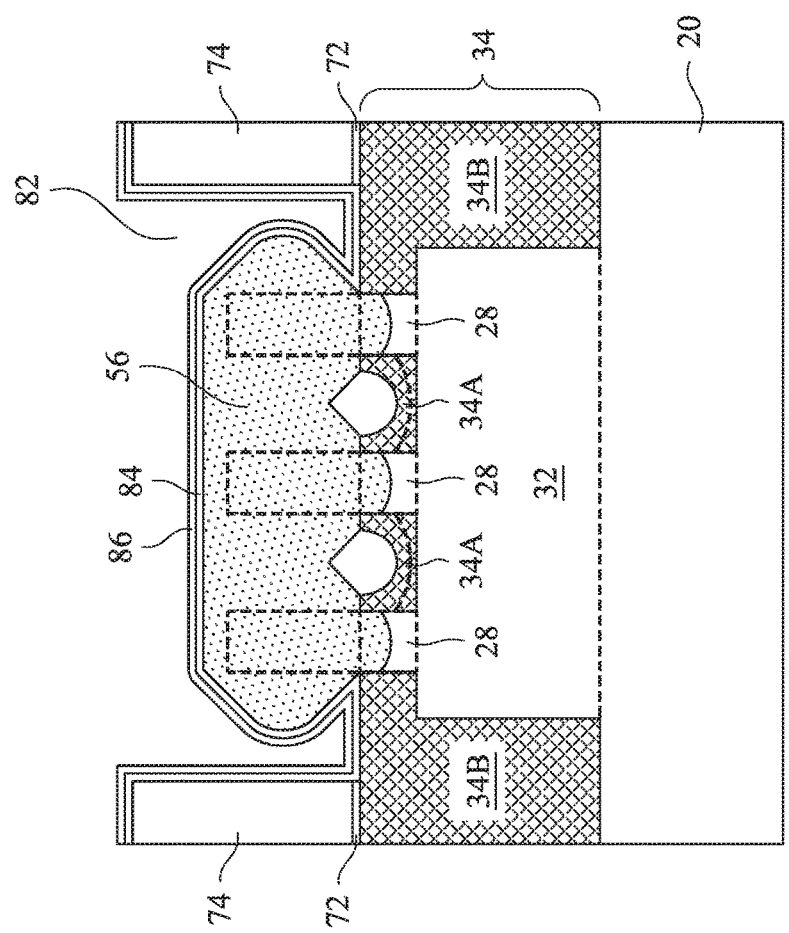

After the formation of replacement gate 80, the process step shown in FIG. 18 is performed, and ILD 74 and CESL 72 are etched to form contact opening 82, so that epitaxy region 56 is exposed. The respective step is illustrated as step 222 in the process flow shown in FIG. 21. Next, metal layer 84 and a metal nitride layer 86 are formed. In accordance with some embodiments of the present disclosure, metal layer 84 is formed of titanium, and metal nitride layer 86 is formed of titanium nitride. Layers 84 and 86 are formed at least on the top surface of epitaxy region 56, and may also be conformal layers extending onto the sidewalls and downward-facing facets of epitaxy region 56. Next, Referring to FIG. 19, an anneal is performed, and source/drain silicide regions 88 are formed on the surfaces of epitaxy region 56, which is the source/drain region of the resulting FinFET 90. The respective step is illustrated as step 224 in the process flow shown in FIG. 21. Source/drain contact plug 92 is then formed in ILD 74, and is electrically connected to the respective source/drain silicide region 88. FinFET 90 is thus formed.

FIG. 20 illustrates the cross sectional view of FinFET 90, in which the cross-sectional view is obtained from the plane crossing line 20-20 in FIG. 19. FIG. 20 illustrates a plurality of replacement gates 80 and a plurality of source/drain regions 56. The plurality of source/drain regions 56 are shared by the plurality of replacement gates 80 as common source regions or common drain regions.

The embodiments of the present disclosure have some advantageous features. The inner-group STI regions confine the growth of epitaxy region, and hence help the formation of air gaps. Also, the deposition and etch-back of epitaxy source/drain regions result in the top surface of the epitaxy source/drain regions to have flatter top surfaces, and the resulting FinFET may achieve better performance.

In accordance with some embodiments of the present disclosure, a method includes forming isolation regions extending into a semiconductor substrate; recessing the isolation regions, so that portions of semiconductor strips between the isolation regions protrude higher than the isolation regions to form semiconductor fins; recessing the semiconductor fins to form recesses; epitaxially growing a first semiconductor material from the recesses; etching the first semiconductor material; and epitaxially growing a second semiconductor material from the first semiconductor material that has been etched back. In an embodiment, the etching the first semiconductor material is performed after the epitaxially growing the first semiconductor material. In an embodiment, the second semiconductor material is different from the first semiconductor material. In an embodiment, the second semiconductor material has a higher n-type impurity concentration than the first semiconductor material. In an embodiment, the second semiconductor material has a higher p-type impurity concentration than the first semiconductor material. In an embodiment, the second semiconductor material grown starting from different recesses merge with each other, and the first semiconductor material grown starting from different recesses do not merge with each other. In an embodiment, the etching back includes an anisotropic etching. In an embodiment, the etching back includes an isotropic etching.

In accordance with some embodiments of the present disclosure, a method includes forming a gate stack on a first semiconductor fin and a second semiconductor fin; etching the first semiconductor fin and the second semiconductor fin to form a first recess and a second recess; growing a first epitaxy region and a second epitaxy region from the first recess and the second recess, respectively; etching back the first epitaxy region and the second epitaxy region; and growing a third epitaxy region and a fourth epitaxy region based on the first epitaxy region and the second epitaxy region, respectively. In an embodiment, the etching back the first epitaxy region and the second epitaxy region is performed when the first epitaxy region and the second epitaxy region are spaced apart from each other. In an embodiment, the etching back the first epitaxy region and the second epitaxy region is performed when the first epitaxy region and the second epitaxy region have been joined with each other. In an embodiment, the third epitaxy region and the fourth epitaxy region join with each other, with an air gap is sealed underneath the joined third and fourth epitaxy regions. The method further includes forming a first isolation region between the first semiconductor fin and the second semiconductor fin, with the first isolation region has a first bottom surface; and forming a second isolation region on an outer side of the first semiconductor fin, with the first and the second isolation regions being on opposite sides of the first semiconductor fin, and the second isolation region has a second bottom surface lower than the first bottom surface. In an embodiment, the forming the first isolation region and the forming the second isolation region are performed in a common process. In an embodiment, the forming the first isolation region and the forming the second isolation region are performed in different proc processes, with the first isolation region and the second isolation region being formed of different materials.

In accordance with some embodiments of the present disclosure, a method includes forming a gate stack on a semiconductor fin; growing an epitaxy region based on the semiconductor fin to form a first portion of a source/drain region; etching the epitaxy region; further growing the epitaxy region; and forming a silicide region on a top surface of the epitaxy region. In an embodiment, in the etching the epitaxy region, corner regions of the epitaxy region are etched back. In an embodiment, the etching the epitaxy region is performed using a process gas free from silicon and germanium containing process gases. In an embodiment, the etching the epitaxy region is performed using HCl as a process gas. In an embodiment, the growing the epitaxy region is performed using a first process gas comprising silicon or germanium and a second process gas comprising HCl.

In accordance with some embodiments of the present disclosure, a method includes forming a first isolation region and a second isolation region, with a semiconductor fin between the first isolation region and the second isolation region, wherein the first isolation region extends deeper into a semiconductor substrate than the second isolation region; recessing the semiconductor fin to form a recess between the first isolation region and the second isolation region; performing a first epitaxy to grow a semiconductor region from the recess; etching the semiconductor region; and performing a second epitaxy to enlarge the semiconductor region. In an embodiment, the forming the first isolation region and the second isolation region are performed in separate processes. In an embodiment, the first isolation region and the second isolation region are formed of different dielectric materials. In an embodiment, the forming the first isolation region and the second isolation region are performed in a common process.

In accordance with some embodiments of the present disclosure, a method includes forming a first isolation region and a second isolation region extending into a semiconductor substrate; forming a first semiconductor fin and a second semiconductor fin, with the first semiconductor fin being between the first isolation region and the second isolation region, and the second isolation region between the first semiconductor fin and the second semiconductor fin, wherein the first isolation region extends into a semiconductor substrate deeper than the second isolation region; recessing the first semiconductor fin and the second semiconductor fin to form a first recess and a second recess, respectively; and growing a semiconductor region from the first recess and the second recess, wherein an air gap is sealed underneath the semiconductor region, and the air gap overlaps the second isolation region. The method further includes etching back the semiconductor region; and performing a second epitaxy to enlarge the semiconductor region. In an embodiment, the growing the semiconductor region is performed to deposit a first semiconductor material, and in the second epitaxy, a second semiconductor material different from the first semiconductor material is deposited.

In accordance with some embodiments of the present disclosure, a method includes forming a first isolation region; forming a second isolation region, wherein a semiconductor strip is between the first isolation region and the second isolation region, and the first isolation region and the second isolation region are formed of different materials; recessing the first isolation region and the second isolation region, so that a portion of the semiconductor strip protrudes higher than the first isolation region and the second isolation region to form a semiconductor fin; forming a gate stack over a first portion of the semiconductor fin; etching a second portion of the semiconductor fin to form a recess; growing a first semiconductor material from the recess; etching the first semiconductor material; and growing a second semiconductor material on the first semiconductor material. In an embodiment, an air gap is sealed under the first and the second semiconductor material. In an embodiment, the second semiconductor material has a composition different from the first semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming isolation regions extending into a semiconductor substrate, wherein the forming the isolation regions comprises:
in a common etching process, etching the semiconductor substrate to form two first trenches and a second trench between the two first trenches;
forming a hard mask layer comprising first bottom portions extending to bottoms of the two first trenches, and a second bottom portion extending to a bottom of the second trench;
performing an etching step, wherein both the two first bottom portions and the second bottom portion are exposed to an etchant used in the etching step, and the first bottom portions and portions of the semiconductor substrate directly underlying the first bottom portions are etched to extend the two first trenches down, and the second bottom portion protects a portion of the semiconductor substrate directly underlying the second bottom portion; and
filling the two first trenches and the second trench with a dielectric material to form isolation regions;
recessing the isolation regions, so that portions of semiconductor strips between the isolation regions protrude higher than the isolation regions to form semiconductor fins;
recessing the semiconductor fins to form recesses;
epitaxially growing a first semiconductor material from the recesses;
etching the first semiconductor material; and
epitaxially growing a second semiconductor material from the first semiconductor material that has been etched back.

2. The method of claim 1, wherein the etching the first semiconductor material is performed after the epitaxially growing the first semiconductor material.

3. The method of claim 1, wherein the second semiconductor material is different from the first semiconductor material.

4. The method of claim 3, wherein the second semiconductor material has a higher n-type impurity concentration than the first semiconductor material.

5. The method of claim 3, wherein the second semiconductor material has a higher p-type impurity concentration than the first semiconductor material.

6. The method of claim 1, wherein the second semiconductor material grown starting from different recesses merge with each other, and the first semiconductor material grown starting from different recesses do not merge with each other.

7. The method of claim 1, wherein the etching back comprises an anisotropic etching.

8. The method of claim 1, wherein the etching back comprises an isotropic etching.

9. A method comprising:
forming a first isolation region between a first semiconductor fin and a second semiconductor fin, with the first isolation region has a first bottom surface;
forming a second isolation region on an outer side of the first semiconductor fin, wherein the first and the second isolation regions are on opposite sides of the first semiconductor fin, wherein the second isolation region has a second bottom surface lower than the first bottom surface;
etching the first isolation region to form a middle recess extending from a top surface of the first isolation region into the first isolation region, wherein the first isolation region comprises opposite portions on opposite sides of the middle recess;
forming a gate stack on the first semiconductor fin and the second semiconductor fin;
etching the first semiconductor fin and the second semiconductor fin to form a first recess and a second recess;
growing a first epitaxy region and a second epitaxy region from the first recess and the second recess, respectively;
etching back the first epitaxy region and the second epitaxy region; and
growing a third epitaxy region and a fourth epitaxy region based on the first epitaxy region and the second epitaxy region, respectively.

10. The method of claim 9, wherein the etching back the first epitaxy region and the second epitaxy region is performed when the first epitaxy region and the second epitaxy region are spaced apart from each other.

11. The method of claim 9, wherein the etching back the first epitaxy region and the second epitaxy region is performed when the first epitaxy region and the second epitaxy region have been joined with each other.

12. The method of claim 9, wherein the third epitaxy region and the fourth epitaxy region join with each other, with an air gap is sealed underneath the joined third and fourth epitaxy regions.

13. The method of claim 9, wherein the forming the first isolation region and the forming the second isolation region are performed in a common etching process, wherein trenches in which an entirety of the first isolation region and a top portion of the second isolation region are formed in the common etching process.

14. The method of claim 9, wherein the forming the first isolation region and the forming the second isolation region are performed in different processes, with the first isolation region and the second isolation region being formed of different materials.

15. A method comprising:
forming a gate stack on a semiconductor fin;
forming gate spacers on sidewalls of the gate stack and fin spacers on sidewalls of the semiconductor fin;
etching the fin spacers;
growing an epitaxy region based on the semiconductor fin to form a first portion of a source/drain region, wherein the epitaxy region extends into a space left by the etched fin spacers;
etching the epitaxy region;
further growing the epitaxy region; and
forming a silicide region on a top surface of the epitaxy region.

16. The method of claim 15, wherein the fin spacers are directly over isolation regions, and the method further comprises, after the fin spacers are removed, further recessing the isolation regions.

17. The method of claim 15, wherein the etching the epitaxy region is performed using a process gas free from silicon and germanium containing process gases.

18. The method of claim 15, wherein the etching the epitaxy region is performed using HCl as a process gas.

19. The method of claim 15, wherein the growing the epitaxy region is performed using a first process gas comprising silicon or germanium and a second process gas comprising HCl.

20. The method of claim 12, wherein the air gap comprises a bottom portion extending into the first isolation region, with the middle recess forming the bottom portion of the air gap.

* * * * *